United States Patent [19]
Palm

[11] Patent Number: 5,924,052
[45] Date of Patent: Jul. 13, 1999

[54] METHOD FOR DETECTING SIGNALS BY MEANS OF FUZZY-LOGIC CLASSIFICATION

[75] Inventor: Rainer Palm, München, Germany

[73] Assignee: Siemens Aktiengesellschaft, Munich, Germany

[21] Appl. No.: 08/776,793

[22] PCT Filed: Aug. 7, 1995

[86] PCT No.: PCT/DE95/01033

§ 371 Date: Feb. 12, 1997

§ 102(e) Date: Feb. 12, 1997

[87] PCT Pub. No.: WO96/05565

PCT Pub. Date: Feb. 22, 1996

[30] Foreign Application Priority Data

Aug. 12, 1994 [DE] Germany ............................. 44 28 658

[51] Int. Cl.[6] ................................................... G06F 17/00
[52] U.S. Cl. ............................ 702/71; 702/70; 702/189; 706/900
[58] Field of Search ................................. 702/71, 70, 73, 702/74, 66, 67, 79, 124–126, 176, 189, 193, 199; 600/500; 364/178, 715.04, 148.05; 701/44, 98; 706/900

[56] References Cited

U.S. PATENT DOCUMENTS 5,000,188  3/1991  Kojima .................................... 600/500
5,245,695  9/1993  Barehore ............................. 364/148.05
5,287,432  2/1994  Tomitaka ................................. 706/900
5,491,775  2/1996  Madau et al. ........................... 706/900

FOREIGN PATENT DOCUMENTS 42 30 692   3/1974   Germany .

OTHER PUBLICATIONS

Holger Franke, Chemnitz, "parallel–FUCS: Einsatzsystem zur On–line–und Real–time–Fuzzy–Klassifikation", 8129 AT Automatisierungstechnik 42(1994) Mar., No. 3, Germany, pp. 118–123. ( No English Translation).

R. Marin, "On knowledge–based fuzzy classifiers: A medical case study", 8355 Fuzzy Sets and Systems 44(1991) Dec. 16, No. 3, Amsterdam, NE, pp. 421–430.

T. Tilli, "Mustererkennung mit Fuzzy–Logik", 1993, pp. 211–257. (No English Translation) (No date with month).

Primary Examiner—Hal Dodge Wachsman
Attorney, Agent, or Firm—Hill & Simpson

[57] ABSTRACT

For the purpose of detecting signals by means of fuzzy-logic classification, these signals are sampled in time and the sampled values are compared with fuzzy threshold values with the aid of fuzzy-logic rules. Strengths which evaluate the similarity of the signal to be detected with the relevant master signal given the application of the relevant rule are determined for each master signal of a signal catalog. Furthermore, a membership is calculated for each master signal as the arithmetic mean of all the strengths, averaged over all the rules, and the signal to be detected is assigned to that master signal whose membership is a maximum.

4 Claims, 2 Drawing Sheets

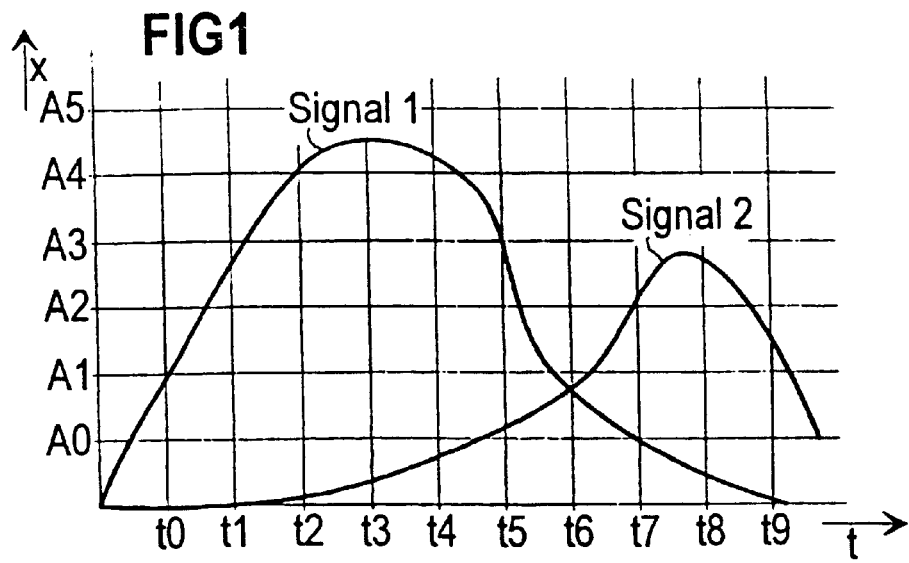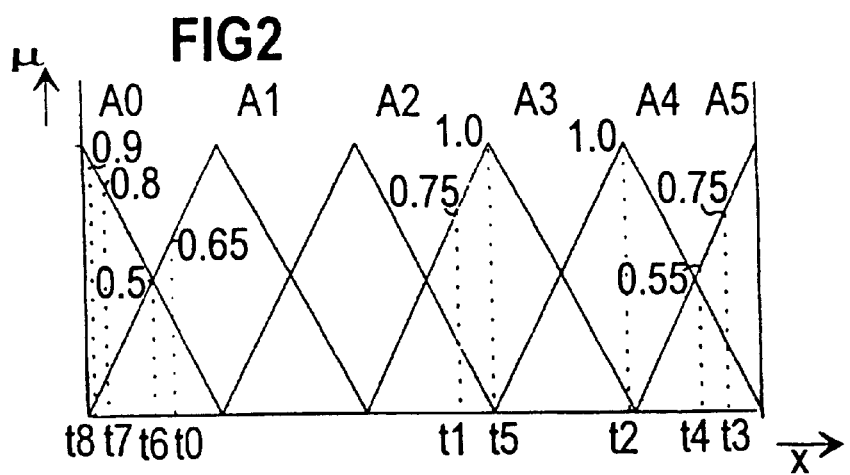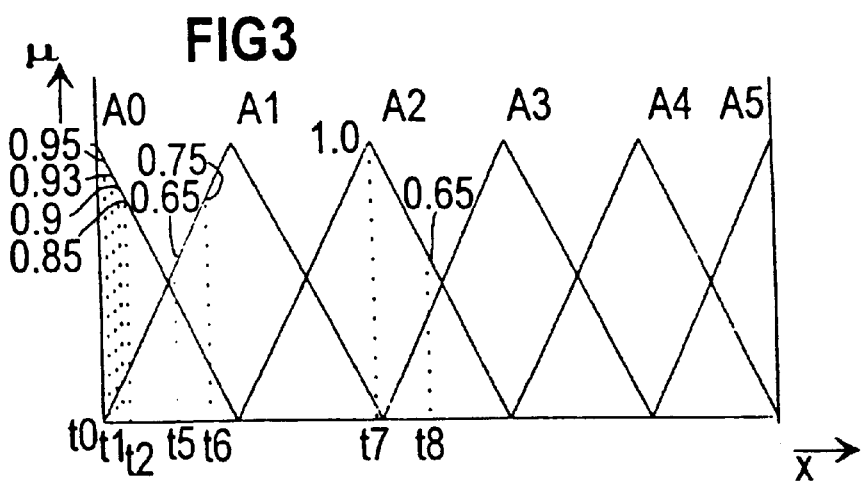

Flow Chart

METHOD FOR DETECTING SIGNALS BY MEANS OF FUZZY-LOGIC CLASSIFICATION

BACKGROUND OF THE INVENTION

1. Field of the Invention

The present invention relates to a method for detecting signals by means of fuzzy-logic classification. Such methods are required in various technical fields for controlling complex systems. In addition to system analysis, the control of a complex system also involves signal analysis for the purpose of being able to draw conclusions for controlled intervention from knowledge of the signal. It is frequently the came that only selected signal parameters are not always adequate but that it should be possible to evaluate the signal waveshape in as complex a way as possible.

2. Description of the Related Art

It is known from U.S. Pat. No. 5,000,188 to classify blood pressure curves in order to determine a person's age. For this purpose, the blood pressure curve of a specific person is examined and compared with representative curves of specific age groups by determining a measure of correlation between the curves, as a result of which the curve which is most similar to the current curve of the test subject is determined from the set of reference curves. The age of the text subject is then deduced from the age of the reference group. Further classification methods for curves are not known.

SUMMARY OF THE INVENTION

It is an object of the invention to provide a method for detecting signals by means of fuzzy-logic classification which satisfies the requirements mentioned at the beginning. This and other objects and advantages are achieved according to the invention by a method for detecting signals by means of fuzzy-logic classification wherein the range of signal amplitude values is subdivided into individual discrete threshold amplitude values; a membership function is defined for each discrete amplitude value in such a way that each has its respective maximum membership in the respective discrete amplitude value; at least one first reference pattern of a first signal to be detected is sampled equidistantly in time, a first reference signal amplitude being determined at each sampling instant; at each sampling instant, there is defined for at least each first reference signal amplitude a first assignment rule which specifies within which interval of two precisely designated directly neighboring threshold amplitude values the first reference amplitude is located at the respective sampling instant; a signal to be detected is sampled equidistantly in time in a fashion identical to the reference pattern, a detection signal amplitude being determined at each sampling instant; for the respective detection signal amplitudes, the membership values are determined in relation to the membership functions of the discrete amplitude values; the membership values are evaluated using the assignment rules as fuzzy-logic rules, and their strength is determined for the respective rules; the strengths of all the fuzzy-logic rules belonging to a respective reference pattern are added up and the arithmetic mean is formed therefrom as a measure of evaluation; the signal to be detected is detected as a first signal if the measure of evaluation is larger than 0.5. A signal catalog is recorded for this purpose and a signal to be identified in compared to it. This catalog can be recorded by a training phase or be produced width the cooperation of an expert. A suitable interval measure is used to determine significant differences. Consequently, only those signals which differ in accordance with this measure are recorded in the signal catalog. In accordance with the invention, a signal occurring is sampled equidistantly in time, and the amplitudes of the sampled values are compared with equidistant threshold values. The equidistant threshold values are assigned triangular membership functions which are equally distributed in the interval under consideration. The set of master signals which is to be identified is always assigned the same set of membership functions. For a selected master signal, membership values are determined for the sampling instant values from the membership functions for the threshold values. A set of rules which characterizes all the master signals is defined for each sampling instant. These rules specify between which threshold values the corresponding master signal lies at the sampling instant under consideration. An unknown signal is then classified by determining the strength for each rule by fuzzifying the amplitude values, and by calculating the average strength for each signal class. An unknown signal is assigned to that signal class for which the highest membership in achieved.

BRIEF DESCRIPTION OF THE DRAWINGS

FIG. 1 is a graph which shows sampled master signals with threshold values in a diagrammatic way.

FIG. 2 is a graph which shows membership functions in a diagrammatic way for a signal S1 from a simple example, for the purpose of explaining the method according to the invention.

FIG. 3 is a graph which shows membership functions in a diagrammatic way for a signal S2 from a simple example, for the purpose of explaining the method according to the invention.

DETAILED DESCRIPTION OF THE PREFERRED EMBODIMENTS

Figure 4:
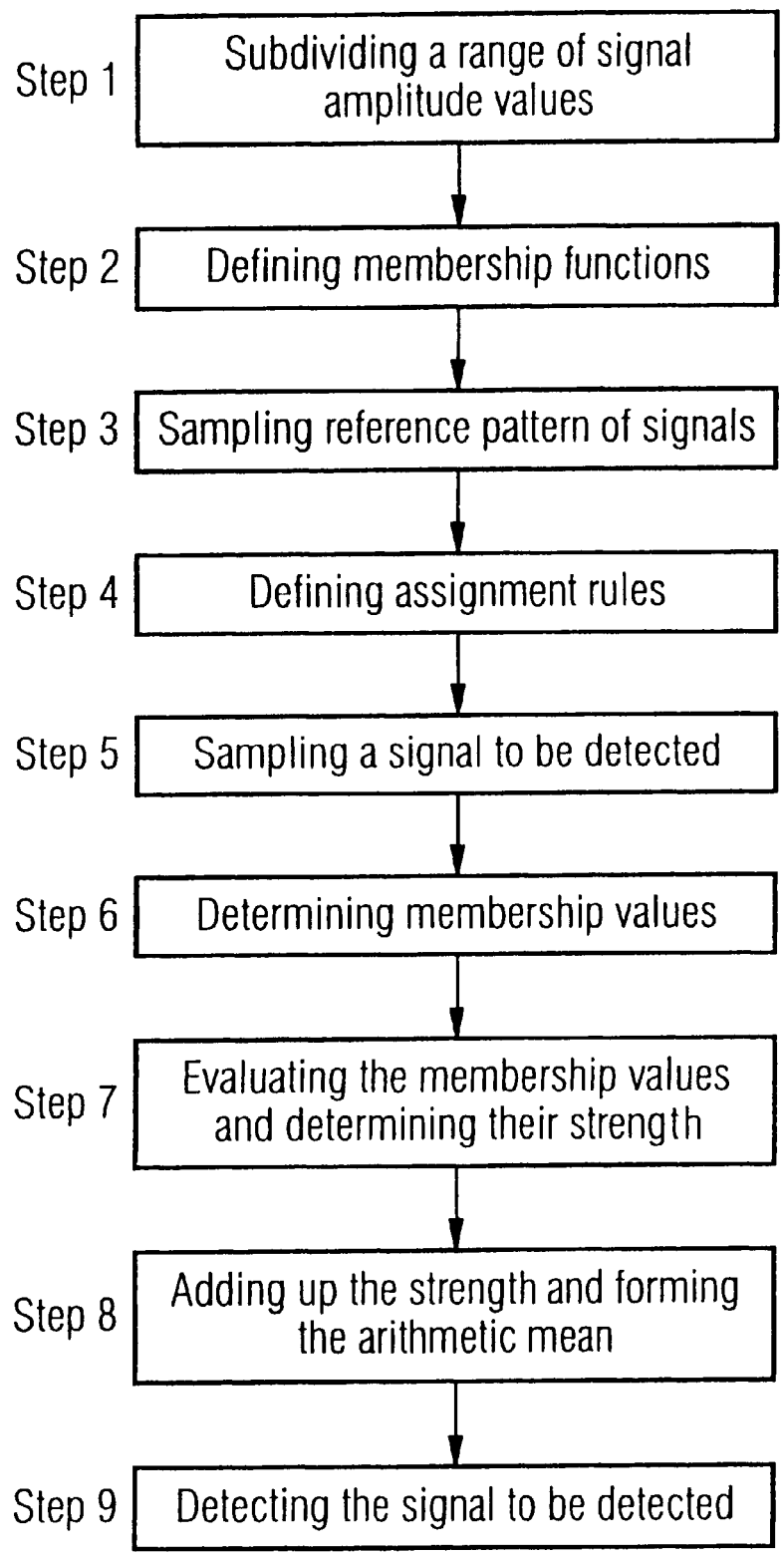
FIG. 4 is a flow chart showing the method steps of the invention.

The invention is described in more detail below with reference to preferred exemplary embodiments and with the aid of the figures.

In addition to system analysis, the control of a complex system also involves signal analysis for the purpose of being able to draw conclusions for controlled intervention from knowledge of the signal. It is frequently the came that only selected signal parameters are not always adequate but that it should be possible to evaluate the signal waveshape in as complex a way an possible.

The present method makes the following assumptions in this case:

The signals to be identified are not to differ significantly.

The signal to be identified is to correspond to a master signal.

The signals to be identified are to be sufficiently smooth.

A signal catalog is then recorded, with which a signal to be identified is compared. This catalog can be recorded with a training phase or be produced with the cooperation of an expert. A suitable interval measure is used to determine significant differences. Consequently, only those signals which differ in accordance with this measure are recorded in the signal catalog. A signal is, furthermore, regarded as sufficiently smooth if there is no change in the rate of variation of the signal between two sampling instants.

In accordance with the invention, a signal which occurs is sampled equidistantly in time with the sampling instants t0, ..., tn, and the amplitudes of the sampled values are compared with equidistant threshold values A0, ..., Am. The equidistant threshold values A0, ..., Am are assigned triangular membership functions, as shown in FIGS. 2 and 3, which are equally distributed in the interval under consideration. The set of master signals which is to be identified is always assigned the same set of membership functions. For a selected master signal, membership values are determined for the sampling instant values t0, ..., tn from the membership functions for the threshold values A0, ..., Am. A set of rules which characterizes all the master signals is defined for each sampling instant t0, ..., tn. These rules specify between which threshold values the corresponding master signal lies at the sampling instant under consideration.

Such a rule set is specified in the following, very simple example for eight sampling instants and two signals S1 and S2:

| | | | | | | |
|---|---|---|---|---|---|---|
| t0: | IF | (A0 OR A1) | THEN S1 | (0.35 OR 0.65) | = | 0.65 |
| | IF | (A0 OR A1) | THEN S2 | (0.35 OR 0.65) | = | 0.65 |
| t1: | IF | (A2 OR A3) | THEN S1 | (0.25 OR 0.75) | = | 0.75 |
| | IF | (A0 OR A1) | THEN S2 | (0.0 OR 0.0) | = | 0.0 |
| t2: | IF | (A3 OR A4) | THEN S1 | (0.0 OR 1.0) | = | 1.0 |
| | IF | (A0 OR A1) | THEN S2 | (0.0 OR 0.0) | = | 0.0 |
| t3: | IF | (A4 OR A5) | THEN S1 | (0.25 OR 0.75) | = | 0.75 |
| | IF | (A0 OR A1) | THEN S2 | (0.0 OR 0.0) | = | 0.0 |
| t4: | IF | (A4 OR A5) | THEN S1 | (0.45 OR 0.55) | = | 0.55 |
| | IF | (A0 OR A1) | THEN S2 | (0.0 OR 0.0) | = | 0.0 |
| t5: | IF | (A2 OR A3) | THEN S1 | (0.0 OR 1.0) | = | 1.0 |
| | IF | (A0 OR A1) | THEN S2 | (0.0 OR 0.0) | = | 0.0 |
| t6: | IF | (A0 OR A1) | THEN S1 | (0.5 OR 0.5) | = | 0.5 |
| | IF | (A0 OR A1) | THEN S2 | (0.5 OR 0.5) | = | 0.55 |
| t7: | IF | (A0 OR A1) | THEN S1 | (0.8 OR 0.2) | = | 0.8 |
| | IF | (A1 OR A2) | THEN S2 | (0.2 OR 0.0) | = | 0.2 |
| t8: | IF | (A0 OR A1) | THEN S1 | (0.9 OR 0.1) | = | 0.65 |
| | IF | (A2 OR A3) | THEN S2 | (0.0 OR 0.0) | = | 0.0 |

An unknown signal is then classified by determining the strength for each rule by fuzzifying the amplitude values, and by calculating the mean strength for each signal class.

The result in our simple example is

S1: (0.65+0.75+1.0+0.55+1.0+0.5+0.8+0.65)/8=0.831

S2: (0.65+0.55+0.3)/8=0.175

An unknown signal is assigned to that signal claim for which the highest membership is achieved.

FIG. 4 illustrates the steps of the present method as described above. Nine method steps are shown.

I claim:

1. A method for detecting signals by fuzzy-logic classification, comprising the following steps:
   a) subdividing a range of signal amplitude values into individual discrete threshold amplitude values;
   b) defining a membership function for each discrete amplitude value, each of said membership functions having a maximum membership in the respective discrete amplitude value;
   c) sampling at least one first reference pattern of a first signal to be detected equidistantly in time, a first reference signal amplitude being determined at each sampling instant;
   d) defining at each sampling for at least each first reference signal amplitude a first assignment rule which specifies within which interval of two precisely designated directly neighboring threshold amplitude values the first reference amplitude is located at a respective sampling instant;
   e) sampling a signal to be detected equidistantly in time in a fashion identical to the at least one first reference pattern, a detection signal amplitude being determined at each sampling instant;
   f) determining for the respective detection signal amplitudes, the membership values in relation to the membership functions of the discrete amplitude values;
   g) evaluating the membership values using the assignment rules as fuzzy-logic rules, and determining their strength for the respective rules;
   h) adding up the strengths of all the fuzzy-logic rules belonging to a respective reference pattern and forming the arithmetic mean therefrom as a measure of evaluation;
   i) detecting the signal to be detected as first signal if the measure of evaluation is larger than 0.5.

2. A method as claimed in claim 1, further comprising the step of:
   detecting at least two signals to be detected by defining assignment rules for the respective signal.

3. A method according to claim 1, further comprising the step of:
   normalizing the membership functions to 1.

4. A method as claimed in claim 1, wherein said membership functions are triangular membership functions.

* * * * *